United States Patent [19]

Nobel et al.

[11] Patent Number: 4,617,097

[45] Date of Patent: * Oct. 14, 1986

[54] PROCESS AND ELECTROLYTE FOR ELECTROPLATING TIN, LEAD OR TIN-LEAD ALLOYS

[75] Inventors: Fred I. Nobel, Sands Point; Barnet D. Ostrow, Roslyn; David N. Schram, Freeport, all of N.Y.

[73] Assignee: LeaRonal, Inc., Freeport, N.Y.

[ * ] Notice: The portion of the term of this patent subsequent to Jan. 21, 2003 has been disclaimed.

[21] Appl. No.: 778,353

[22] Filed: Sep. 20, 1985

Related U.S. Application Data

[63] Continuation-in-part of Ser. No. 564,516, Dec. 22, 1983, Pat. No. 4,599,149, which is a continuation-in-part of Ser. No. 301,390, Sep. 11, 1981, abandoned.

[51] Int. Cl.$^4$ .................. C25D 3/32; C25D 3/36; C25D 3/56; C25D 3/60
[52] U.S. Cl. .................. 204/44.4; 204/53; 204/54.1
[58] Field of Search .............. 204/53, 54 R, 44.4, 204/123, 114, 120

[56] References Cited

U.S. PATENT DOCUMENTS

| | | | |
|---|---|---|---|
| 2,525,942 | 10/1950 | Proell | 204/45 |
| 3,663,384 | 5/1972 | Lescure | 204/44.4 |
| 3,905,878 | 9/1975 | Dohi et al. | 204/45 |
| 4,000,047 | 12/1976 | Ostrow et al. | 204/43 S |
| 4,132,610 | 1/1979 | Dohi et al. | 204/44.4 |
| 4,384,930 | 5/1983 | Eckles | 204/43 |
| 4,388,158 | 6/1983 | Inui et al. | 204/27 |
| 4,459,185 | 7/1984 | Obata et al. | 204/43 S |

FOREIGN PATENT DOCUMENTS

| | | | |
|---|---|---|---|
| 122265 | 9/1976 | German Democratic Rep. | 204/44.4 |
| 555929 | 9/1943 | United Kingdom | 204/44.4 |

OTHER PUBLICATIONS

Dohi et al., "Bright Solder and Indium Plating from Methane Sulfonic Acid", Proceeding of Electroplating Seminar, 7/78.

Dohi et al., "Electrodeposition of Bright Tin–Lead Alloys from Alkanolsulfonate Baths", Proceedings of Interfinish 80.

*Primary Examiner*—G. L. Kaplan
*Attorney, Agent, or Firm*—Pennie & Edmonds

[57] ABSTRACT

A process and bath for electroplating tin, lead and tin-lead alloys. Improved brightness, solderability and broader current density ranges are achieved by the use in the baths of a soluble alkylene oxide condensate to provide a cloud point of the bath above about 90° F., a soluble bismuth compound, an aromatic aldehyde and acetaldehyde. Tin and lead are supplied to the bath as salts of alkyl or alkylol sulfonic acids with sufficient free alkyl or alkylol sulfonic acid to provide a bath pH of less than 3.

20 Claims, No Drawings

PROCESS AND ELECTROLYTE FOR ELECTROPLATING TIN, LEAD OR TIN-LEAD ALLOYS

This application is a continuation-in-part of application Ser. No. 564,516, filed Dec. 22, 1983 and now U.S. Pat. No. 4,599,149, which in turn was a continuation-in-part of application Ser. No. 301,390 filed Sept. 11, 1981 and now abandoned.

TECHNICAL FIELD

The invention relates to the preparation of alkyl and alkylol sulfonate electrolytic plating baths for electroplating tin, lead and particularly tin-lead alloys.

BACKGROUND OF THE INVENTION

The time-honored method for plating tin-lead alloys, commonly called Solder Plate, is to have these two metals present in solution as fluoborates with an excess of fluoboric acid and boric acid. In order to obtain smoother deposits, it is common to add various types of proteins, such as peptones, glue, gelatin or meat proteins. The fluoborate-based bath containing peptone is most commonly used and it is commercially successful in obtaining smooth matte deposits. Brighter tin-lead solder deposits can be obtained from these fluoroborate based baths by adding various brightening agents, such as aromatic aldehydes, pyridine compounds, ethylene oxide wetting agents and formaldehyde.

The main problem with these fluoborate-based baths is the fluoborate ion itself. Fluoborates are not only highly poisonous but are also highly corrosive to the equipment used in the plating environment. Fluoborates are also difficult to remove from the waste water that follows the plating operation and presents a serious problem for the waste-disposal engineer.

Alkane or alkyl sulfonic acids containing 1 to 5 carbon atoms in the alkyl group have previously been used in electrolytic plating baths. See, for example, U.S. Pat. No. 2,525,942 to Proell.

Alkanolsulfonates, phenolsulfonates and cresolsulfonates have also been used in electroplating baths. See, for example, the article entitled ELECTRODEPOSITION OF BRIGHT TIN-LEAD ALLOYS FROM ALKANOLSULFONATE BATH by N. Dohi and K. Obata, Proceedings of Interfinish 80, as well as U.S. Pat. Nos. 4,132,610 and 3,905,878.

U.S. Pat. No. 4,459,185 to Obata el al. discloses alkyl or alkanol sulfonic acid baths for plating tin, lead, or tin-lead alloys. These baths contain at least one cationic, amphoteric or nonionic surfactant along with a levelling agent.

None of the prior art, however, discloses the applicant's novel methods for preparing tin-lead electrolytes. Furthermore, none of the prior art recognized the addition of various additives for specific purposes, as is disclosed hereinbelow.

SUMMARY OF THE INVENTION

This invention relates to methods for preparing electrolytes for electroplating tin, lead and particularly tin-lead alloys. The electroplating bath comprises a lead and/or tin alkyl or alkyol sulfonate, an excess of an alkyl or alkylol sulfonic acid sufficient to bring the pH of the bath below about 3 and advantageously to less than about 2, and various additives to improve the brightness of the deposits, the useful current density ranges, and/or the solderability of tin-lead alloy deposits. Such additives include certain alkylene oxide compounds, quaternary nitrogen wetting agents containing a fatty acid radical, aromatic aldehydes, acetaldehydes and/or bismuth compounds.

DETAILED DESCRIPTION OF THE INVENTION

The tin and lead compounds useable according to the invention are those which are soluble in the alkyl or alkylol sulfonic acids and which will form an alkyl or alkylol sulfonic acid salt. Certain alkyl sulfonic acids and their tin and lead salts are known compounds and may be readily prepared by those skilled in the art in the manner disclosed, for example, in U.S. Pat. No. 2,525,942, as well as in the prior art cited in that patent. The alkylol sulfonic acid salts may also be formed in a similar manner.

The preferred alkyl or alkylol sulfonic acids useful according to the invention are those which are water soluble or soluble in the overall electrolyte. This would include the lower alkyl or alkylol sulfonic acids containing about 1-7 carbon atoms.

The tin and/or lead metals can be added to the baths in various forms and do not have to be added as a soluble alkyl or alkylol sulfonate salt. Lead, for example, can be added as lead acetate. Thus, these baths may contain ions other than sulfonate ions so long as sufficient sulfonate ions are present to produce the advantageous results of the invention. However, the metals should predominate as sulfonates in the electrolytes of this invention.

The amount of the total metal salt when using alkyl or alkylol sulfonic acids is advantageously less than about 8 percent by weight when the electrolyte is used at low current densities and high throwing power is desired. Increased amounts of the metal salts significantly decrease the throwing power of the solution particularly at low current densities. The most advantageous amounts are from about 4.5 to 2 percent of the metal salt or about 3 to 1 percent of the metal or metals as the sulfonic acid salt.

The invention includes improved tin and/or lead alkyl or alkylolsulfonic acid baths containing quaternary nitrogen-fatty acid based wetting agents to improve the high current density range and throwing power of the bath as well as the surface finish of the resulting deposit.

The preferred quaternary nitrogen-fatty acid based wetting agents are amphoteric and are the water or solution soluble imidazoline, monoazoline and/or amidobetaine compounds. These types of wetting agents are well known in the art and are commercially available from Lonza Inc. under the tradename AMPHOTERGE, by Miranol Chemical Company, Inc. under the tradenames MIRANOL, and MIRATAINE and by Mona Industries Inc. under the tradename MONATERICS. Other manufacturers of these materials are also available. AMPHOTERGE compounds are alkyl dicarboxy imidazoline surfactants, which can generally be categorized as alkyl imidazolines. Also, as noted below, salts of these compounds may also be used. The only limitation on the use of these compounds is that they must be soluble in the electrolyte.

The MONATERICS wetting agents include ampholytic amino-betaine and imidazoline derivatives. This would include monazoline compounds such as 1-(hydroxyethyl)-2-alkyl imidazolines.

The most preferred compounds are the imidazolines having the formula:

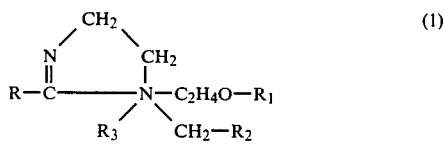

in which R is a fatty acid radical; $R_1$ is H, Na or $CH_2COOM$; $R_2$ is COOM, $CH_2COOM$ or $CHOHCH_2SO_3M$; M is Na, H or an organic base; and $R_3$ is OH, an acid salt or the salt of an anionic surface active sulfate or sulfonate.

The most advantageous compounds are those in which R contains 6 carbon atoms or more, $R_1$ is $CH_2COOM$, $R_2$ is COOM and $R_3$ is OH. Best results to date have been obtained from the compound where R is $C_7H_{15}$ (capric), $R_1$ is $CH_2COONa$, $R_2$ is COONa and $R_3$ is OH (AMPHOTERAGE KJ-2).

Carboxylic or sulfonic acid-fatty acid wetting agents containing tertiary nitrogen, such as the compound of formula (5), can also be used and the quaternary formed in suit by the acid contained in the bath. This same compound where R is $C_{12}H_{20}$ (coconut oil), also gives excellent results. Oleic hydroxyethyl alkyl imidazole and N' cocoylN-N' dimethy glycine are other specific examples of imidazoline wetting agents.

Other compounds found to be useful according to the invention include:

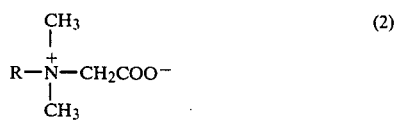

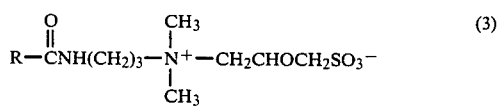

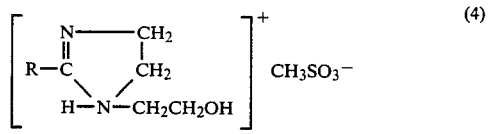

and

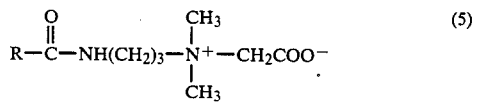

where R has the same meaning as assigned above with respect to formula (1). The chain lengths of the various alkyl radicals and groups can also be varied so long as water or solution solubility is maintained and the compounds retain wetting agent properties.

The compounds of formulas (3) and (4) are, at present, of secondary interest. Examples of some specific compounds of formulas (3) and (4) include dimethyl[-3cocoamidopropyl]ammonioethanoate and cocoamidopropyl dimethyl ammonia-2-hydroxy-propane sulfonate. They produce improved finishes and throwing power but not as well as the compounds of formulas (1) and (2). Compounds according to formulas (1) and (2) produce solder deposits of a smooth matte finish equal in every way to those obtained from the peptone con-taining fluoborate based baths that are commonly used in industry today.

R has been designated in the above formulas as being a fatty acid radical. The fatty group can be saturated or unsaturated. The only upper limit on the number of carbon atoms would be the solubility of the compound in the bath solution and this may vary depending on the compound being used. For example, the compound of formula (2) can contain more carbon atoms in the fatty group than that of formula (1) and still retain water solubility. The particular anion in the above formulas is not critical but sodium is preferred. Mixtures of the wetting agents can also be used.

The amphoteric wetting agents useful according to this invention are broadly defined as quaternary nitrogen wetting agents containing an acid group derived from a fatty acid and one or more solubilizing groups. The solubilizing group can be a carboxylic or sulfonic acid group, alkanol group, etc.

The amount of these wetting agents is not critical and optimum amounts will vary depending on the particular agent selected for use and the particular bath in which it is used. A sufficient amount of the wetting agent should be used to obtain the results desired. Generally, 1 to 2 ml/l of the wetting agents give excellent results with pure tin and 60/40 tin-lead alloy baths. Higher amounts could be used but there is no particular reason to do so. As the lead content of the bath is increased, additional amounts of these wetting agents may have to be employed. Pure lead baths may require as much as 40 ml/l or more of these wetting agents to obtain improved surface characteristics and improved throwing power.

The addition of the quaternary nitrogen wetting agents markedly improved the coverage of electrodeposit at low current densities (5-20 ASF) and the baths are thus particularly advantageous for rack plating, such as circuit boards, where low current densities are employed and high throwing power is required. With the more advantageous wetting agents, coverage can be obtained at current densities even as low as 1 or 2 ASF.

The plating baths of this invention can also be advantageously used to produce bright deposits by the addition of materials that are also commonly used for the fluoborate type baths when bright deposits are desired. These known brighteners are advantageously aromatic aldehydes such as chlorobenzaldehyde, benzaldehyde, and benzal acetone. Other brightening agents which have been used with the fluoborate baths include aromatic pyridine compounds, ethylene oxide wetting agents and formaldehyde. These materials can be used in substantially the same proportions as used in the fluoborate baths.

Suitable ethylene oxide wetting agents which have been used as brighteners include condensation products of ethylene oxide and alkyl phenols or higher alcohols (as shown in British Patent Specification No. 1,151,460 and U.S. Pat. No. 3,905,878); aliphatic alcohol, sorbitan alkyl ester, or alkyl phenol ethylene oxide condensates (U.S. Pat. No. 3,875,029); alkyl phenoxy poly(ethyleneoxy) ethanols (U.S. Pat. No. 4,242,182); water soluble ethers of polyglycols (U.S. Pat. No. 3,361,652); polyethylene glycol-derived alkylphenol, ether, or alkylamide compounds (U.S. Pat. No. 3,661,730); polyoxy alkylated compounds such as polyethoxylated alkyl phenols or polyethoxylated fatty acid monoalkanolamides and related amines (U.S. Pat. No. 4,118,289); and condensation products or polyalkylene oxides with other compounds (Table III of U.S. Pat. No. 4,000,047).

The previously described alkylene oxide compounds have been used in fluoborate tin and tin-lead plating baths for many years. The prior art always considered all alkylene oxide compounds as being substantially equivalent to each other. For small scale or test applications, this may be true. It has now been found, however, that many of the alkylene oxide compounds cannot be used commerically in alkyl or aklylol sulfonic acid based plating baths. Those alkylene oxide compounds having a cloud point below about 90° F. cause reduced cathode efficiency and the resulting electrodeposits exhibit poor solderability in comparison to baths containing an alkylene oxide compound whose cloud point is above about 90° F.

Some alkylene oxide compounds, when used in the alkyl or alkylol sulfonic acid based baths, will be clear when the alkylene oxide is initially added, but after about a day's use, will become cloudy. The plating bath can then be expected to lose cathode efficiency and produce a deposit with reduced solderability characteristics. As noted above, it is the cloud point of the alkylene oxide in the particular electrolytic solution being used that is important rather than the cloud point of the alkylene oxide in water alone, since the environmental conditions of the bath change the cloud point. The phenomenon can be either detrimental of beneficial. It is detrimental when the bath evironment causes the cloud point to decrease below 90° F. This can occur either upon formulation of the bath or after use of the bath over time.

Other agents and compounds in the bath affect the cloud point of baths containing such alkylene oxide compounds. These agents can change the cloud point which the alkylene oxide compound would have in water by to a higher or lower value. The addition of an imidazoline compound for example, will raise the cloud point of baths containing various alkylene oxide surface active agents. Thus, in such instances, alkylene oxide compounds having a cloud point below about 90° F. in water along can be used in such electrolytes provided that the cloud point is not so low that it cannot be raised to the desired level (i.e., at least about 90° F.) by the addition of the imidazolines or other similar agents. Only baths containing alkylene oxide compounds which have or can achieve the appropriate cloud point (i.e., above 90° F.) in the bath environment can be used according to this invention.

These baths can be used to produce smooth matte deposits in the low current density range (5–20 ASF) and, after fusing, the deposit surfaces are smooth, finer grained, bright and showed good solderability. In the high current density range the deposits are dark with 30 to 50% of the area burnt. However, the use of the proper alkylene oxide compounds increases the plating range over which useful deposits can be obtained.

According to this invention, the most preferred alkylene oxide wetting agents are the condensation products of ethylene oxide and/or propylene oxide with styrenated phenols, high alcohols, alkyl phenols, alkyl napthols, fatty acid amines, alkyl amines, esterified sorbitan, phosphate, or fatty acid amides. Only those condensates which utilize at least 8 and preferably 12 or more moles of alkylene oxide (i.e., ethylene oxide, propylene oxide, or mixtures thereof), will consistently provide the necessary bath cloud point of greater than 90° F.

Examples of preferred compounds useful for forming such condensates with the alkylene oxide components include the styrenated phenols preferably mono, di- or tri-styrenated phenol, mono- or di-styrenated cresol, and mono- or di-styrenated phenylphenol. Typical of the higher alcohols are octanol, decanol, lauryl alcohol, tetradecanol, hexadecanol, stearyl alcohol, eicosanol, cetyl alcohol, oleyl alcohol and docosanol. Illustrative of the alkyl-phenols are mono-, di- or tri-alkyl substituted phenols such as p-tertiary-butylphenol, p-isooctylphenol, p-nonylphenol, p-hexylphenol, 2,4-dibutylphenol, 2,4 6-tributylphenol, p-dodecylphenol, p-laurylphenol and p-stearylphenol. The alkylnaphthols include alkylated $\alpha$- or $\beta$-naphthols. The alkyl substituent in the alkylnaphthols includes methyl, ethyl, propyl, butyl, hexyl, octyl, decyl, dodecyl and octadecyl, and may be in any position of the napthalene necleus. The fatty acid amide may be amides of propionic, butyric, caprylic, lauric, myristic, palmitic, stearic and behenic acids. The phosphates are esters obtained by esterifying one or two hydroxyl groups of phosphoric acid with a $C_1$-$C_{20}$ alcohol. Typical of the sorbitan esterified with a higher fatty acid are mono-, di- or tri-esterified 1,4-, 1,5- or 3,6-sorbitan, for example, sorbitan monolaurate, sorbitan monopalmitate, sorbitan monostearate, sorbitan oleate, sorbitan dilaurate, sorbitan dipalmitate, sorbitan distearate, sorbitan dioleate and mixed fatty acid esters of sorbitan. Those skilled in the art are aware of other compounds which may be used to form the alkylene oxide compounds of the invention. As noted above, at least 8 moles of alkylene oxide compounds are required.

The use of the quaternary nitrogen-fatty acid compounds, particularly the imidazolines, used in combination with the alkylene oxide compounds, gives further improvements than would be expected, i.e., they act synergistically.

The pyridine or quinoline compounds useful according to this invention are those described in U.S. Pat. No. 4,000,047. The pyridine compounds are preferred. The amounts of pyridine or quinoline compounds incorporated into the elctrolytes of this invention can be the same as disclosed in U.S. Pat. No. 4,000,047.

The aromatic aldehydes, as well as the amounts, useful according to this invention are also those described in U.S. Pat. No. 4,000,047.

Thus, U.S. Pat. No. 4,000,047 is incorporated herein by reference, particularly with regard to its disclosure of the types and amounts of pyridines, quinolines, and aromatic aldehydes which can be used in accordance with this invention.

Bismuth compounds may be used in this invention to improve the low current density brightness of the deposits. The bismuth compounds useful in this invention are those which are water or solution soluble and the anion produced by the bismuth compound should not interfere with the tin or lead salts, such as by causing precipitation thereof. Bismuth nitrate is an example of an acceptable bismuth compound. The amount of bismuth should be sufficient to obtain the desired low current density range. As little as 0.1 g/l of bismuth metal as bismuth nitrate can lower the useful current density range to close to zero ASF, thus rendering the baths very useful for barrel plating. Bismuth alone does not give the brightness at low current densities. However, bright deposits may be obtained if an aromatic aldehyde and/or an ethylene oxide wetting agent is used in combination with the bismuth compounds.

Acetaldehyde may be used to increase the high current density of the plating bath. The degree of increase is extraordinary, unexpected and highly dramatic. The amount of acetaldehyde should be sufficient to raise the useful current density range to that desired. 1 ml/l has been found sufficient to raise the current density range from a high of 40 ASF (without acetaldehyde) to 200 ASF.

The particular combination of additives employed with the basic electrolyte will depend on the results or types of deposits desired. Matte deposits with good solderability can be obtained using an alkylene oxide of the appropriate cloud point and an imidazoline or quaternary compound. Bright deposits can be obtained by adding ethylene oxide and an aromatic aldehyde. The useful current density can be extended to the high range (20 to 200 ASF) by the addition of acetaldehyde and to the low range of slightly above zero to about 40 by the addition of a bismuth compound.

The plating bath can be prepared by placing tin and/or lead sulfonic acid salt in an excess of the alkyl or alkylol sulfonic acid, adjusting the acid content to the required pH, removing undissolved matter filtration, and then diluting with water to the final desired volume. The plating bath is generally operated at ambient temperatures. Agitation is desirable for increased plating speed.

Various alloys can be produced depending on the tin-lead metal ratios employed in the plating solutions. For plating a 60:40 tin-lead alloy, for example, 20 g/l of tin metal and 10 g/l of lead metal can be used. With such a bath, alkylsulfonic acid is advantageously present at about 150 g/l of 100 percent alkylsulfonic acid.

The addition of a small amount of a reducing agent to the baths will assist in keeping the tin in the soluble divalent state. This helps avoid conversion of divalent tin to tetravalent tin, which is generally insoluble in the bath enviroment. About 0.5 g/l of resorcinol or a similar agent is generally sufficient to accomplish this purpose.

EXAMPLES

The scope of the invention is further described in connection with the following examples which are set forth for the purposes of illustration only and are not to be construed as limiting the scope of the invention in any manner.

EXAMPLE 1

2 ml/l of capric dicarboxy imidazoline, a product of Lonza Inc. marketed under the trademark AMPHOTERGE KJ-2, was added to the following bath:
Tin metal (as the methane sulfonate): 18 g/l
Lead metal (as the methyl sulfonate): 9 g/l
Methyl sulfonic acid (100% basis): 70 ml/l
Plating was accomplished at ambient temperature and at 5 to 15 ASF. The resulting 60:40 tin/lead alloy deposit is white matte and the low current density coverage is markedly improved as compared to the bath run under the same conditions without the imidazoline. The deposit obtained without the imidazoline was a dark grey matte.

EXAMPLE 2

2 ml/l of AMPHOTERGE KJ-2ml/l of a coco betaine according to formula (2) where R is the coco alkyl radical and marketed by the Miranol Chemical Co., Inc. under the trademark MIRATAINE CDMB is added to the following bath:
Tin metal (as the methane sulfonate): 20 g/l
Methane sulfonic acid (100% basis): 70 ml/l
Room temperature
Current density: 5-15 ASF The pure tin deposit has a white matte appearance and the low current density coverage is markedly improved as compared to the bath run without the imidazolines. The deposit obtained without the imidazoline has a dark grey matte appearance.

EXAMPLE 3

4 ml/l of a coconut imidazoline amphoteric surfactant manufactured by Mona Industries, Inc. under the tradename MONATERIC CA was added to the following bath:
Tin metal (as methyl sulfonic acid): 90 g/l
Methyl sulfonic acid (100% basis): 150 ml/l
Room temperature
Current density: 10-25 ASF A white matte deposit and the low current density coverage is considerably improved as compared to the same bath run under the same conditions without the imidazoline. The deposite without the imidazoline has a dark grey matte appearance.

EXAMPLE 4

40 ml/l of 1-hydroxyethyl-2-oleicimidazoline is added to the following plating bath:
Lead metal (as acetate): 15 g/l
Methyl sulfonic acid (100% basis): 50 ml/l
Room temperature
Current density: 5-15 ASF The resulting pure lead deposit has a white matte appearance and the low current density coverage is considerably improved as compared to the bath run under the same conditions without the imidazoline. The deposit without the imidazoline has a dark grey matte appearance.

EXAMPLE 5

Tim metal (as methane sulfonic acid): 20 g/l
Lead metal (as methane sulfonic acid): 2 g/l
Methane sulfonic acid (100% basis): 70 ml/l
AMPHOTERGE KH-2 (by Lonza): 1 ml/l
Current density: 2-30 ASF The deposits produced are white matte and analyze 90% tin, 10% lead. Other alloys are possible by adjusting the ratios of tin and lead in the plating bath.

It is also possible to add conducting salt if needed to improve solution conductivity or throwing power of the bath. The alkali salt of the sulfonic acid adjusted to the pH of the bath can, for example, be used for this purpose.

EXAMPLE 6

Tin metal (as methyl sulfonic acid): 15 g/l
lead metal (as methyl sulfonic acid): 2 g/l
Sodium salt of methyl sulfonic acid: 75 g/l
AMPHOTERGE KJ-2 (by Lonza): 1½ml/l
pH (adjusted with methyl sulfonic acid): 2.0
Room temperature
Current density: 20-40 ASF The above bath produces a white matte deposit.
The following Examples employed the following basic electrolyte bath:
Tin as stannous methane sulfonate: 18 g/l Lead as lead methane sulfonate: 9 g/l
Methane sulfonic acid: 150 g/l Hull Cell panels are run for 5 minutes at 1 amp. total current in all of the following Examples:

EXAMPLE 7

10 g/l polyoxyethylene lauryl ether (23 moles ethylene oxide condensate) Brij-35-Atlas) was added to the basic electrolyte.

The bath produces a Hull Cell panel that is smooth and matte in the low current density range with about 30 to 50% burn in the high current density areas. After fusing, the deposit surface is very smooth, bright and leveled showing good solderability.

EXAMPLE 8

To Example 7, 1 g/l capric dicarboxyimidazoline amphoteric surfactant (AMPHOTERGE KJ-2 Lonza) is added. This bath provides an increased high current density range with no evidence of burning of darkening of the deposit. After fusing, the deposit is very smooth, bright and leveled showing good solderability.

EXAMPLE 9

10 g/l nonyl phenol/12 ethylene oxide condensate are added to the basic electrolyte. The bath provides a smooth deposit with only 50% of the high current density range dark and burnt.

EXAMPLE 10

To Example 9, 0.18 g/l of a picolinic acid, 0.1 g/l of allylether of orthoxyhydroxybenzaldehyde and 0.16 ml/l orthochlorobenzaldehyde are added.

The deposits from this bath exhibit a bright current density range from 15 to 40 ASF. The low current density range is hazy to dull and the high current density range dull burnt.

EXAMPLE 11

To Example 10, 1 ml/l acetaldehyde was added. the deposit is brilliant to current density ranging from 20 to 200 ASF. This example shows the power of acetaldehyde in the alkyl or alkylol sulfonic acid electrolytes containing the brighteners of Example 10 to drastically raise the useful current density range.

EXAMPLE 12

To Example 10, 0.1 g/l bismuth metal as bismuth nitrate is added. The bath provides a deposit with brilliance at current density ranging from near 0 to 40 ASF.

This example shows the power of bismuth in the alkyl sulfonic acid electrolyte containing the brighteners of Example 10 to drastically reduce the useful current density range to very low values.

EXAMPLE 13

(Comparative)

0.1 g/l bismuth metal as bismuth nitrate is added to the bath of Example 7 and there is no improvement in the low current density areas. This shows the low current density improvement and synergism provided by the use of bismuth in combination with the aromatic aldehydes and brighteners listed in U.S. Pat. No. 4,000,047.

EXAMPLE 14

Example 11 is repeated but in this case the picolinic acid was left out. The deposit is brilliant with the bright current density ranging from 40-200 ASF. This example shows that it is possible to eliminate the pyridine type materials of patent 4,000,047 and still get good results in the higher current density ranges. There is some loss in the low current density range—from a lower limit of 20 ASF in Example 11 to 40 ASF in this example, but this loss is not significant in those applications where only the high current density range is needed or desired.

EXAMPLE 15

(Comparative)

A plating bath was prepared as follows:
Dihydroxy propane sulfonic acid: 160 ml/l
Tim metal as stannous dihydroxypropane sulfonate: 18 g/l
Lead metal as lead dihydrioxypropane sulfonate: 9 g/l
Hull cell tests were performed at 1 amp for 5 minutes and produced a matte deposit with nodules and poor throwing power.

EXAMPLE 16

5 g/l Amphoterge K-2 (Lonza) (capric dicarboxyimidazoline amphoteric surfactant) was added to Example 15 above. The bath produced more uniform deposits with poor throwing power.

EXAMPLE 17

8 g/l Pluronic L-62 [poly(oxypropylene)poly(oxyethylene) block polymer/20% ethylene oxide content] was added to the bath of Example 2.

A Hull cell test at 1 amp for 5 minutes produced a uniform matte panel with acceptable throwing power.

EXAMPLE 18

The following bath was prepared:
2-hydroxypropane sulfonic acid: 150 ml/l
Tim metal as stannous-2-hydroxy propane sulfonate: 15 g/l
Lead metal as Lead-2-hydroxy propane sulfonate: 5 g/l
Nonyl phenol/12 moles ethylene oxide condensate: 10 g/l
Picolinic acid: 0.18 g/l
Allylether or orthohydroxybenzaldehyde 0.10 g/l
Orthochlorobenzaldehyde: 0.16 g/l
Acetaldehyde: 1.0 ml/l The deposits obtained from this bath were bright within the 20 to 100 ASF range. These additives act synergystically to brighten the full current density range and seem to work with any sulfonic acid electrolyte.

In all of the above Examples, the electrolytic solutions were diluted with water to form the desired volume.

While it is apparent that the invention herein disclosed is well calculated to achieve the desired results, it will be appreciated that numerous modifications and embodiments may be devised by those skilled in the art, and it is intended that the appended claims cover all such modifications and embodiments as fall within the true spirit and scope of the present invention.

What is claimed is:

1. A method for preparing an electrolyte for electroplating tin, lead or tin-lead alloys which comprises:
adding to a suitable solvent a predetermined amount of a soluble divalent tin compound, a soluble divalent lead compound, or both, and a soluble alkyl or alkylol sulfonic acid in an amount sufficient to provide a solution having a pH of less than about 3;

adding to said solution, a sufficient amount of a soluble alkylene oxide condensate compound having at least about 8 moles of alkylene oxide to provide an electrolyte having a cloud point above about 90° F. to improve the cathode efficiency during electroplating and to produce tin, lead or tin-lead alloy electrodeposits having good solderability; and adding to said solution a sufficient amount of a soluble bismuth compound to improve the low current density range for electroplating or the brightness of the resultant electrodeposits.

2. The method of claim 1 which further comprises adding to said electrolyte a sufficient amount of an aromatic aldehyde to improve the brightness of the deposit produced by electroplating.

3. The method of claim 2 which further comprises adding to said electrolyte a sufficient amount of acetaldehyde to improve the high current density electroplating range.

4. A method for electroplating tin, lead, or tin-lead alloys upon a substrate which comprises:
preparing an electrolyte according to the method of claim 3;
immersing at least a portion of a substrate into said electrolyte; and
electroplating a predetermined tin, lead, or tn-lead alloy upon said substrate.

5. A method for electroplating tin, lead, or tin-lead alloys upon a substrate which comprises:
preparing an electrolyte according to the method of claim 2;
immersing at least a portion of a substrate into said electrolyte; and
electroplating a predetermined tin, lead, or tin-lead alloy upon said substrate.

6. The method of claim 1 which further comprises adding to said electrolyte a sufficient amount of acetaldehyde to improve the high current density electroplating range.

7. A method for electroplating tin, lead, or tin-lead alloys upon a substrate which comprises:
preparing an electrolyte according to the method of claim 6;
immersing at least a portion of a substrate into said electrolyte; and
electroplating a predetermined tin, lead, or tin-lead alloy upon said substrate.

8. A method for electroplating tin, lead, or tin-lead alloys upon a substrate which comprises:
preparing an electrolyte according to the method of claim 1;
immersing at least a portion of a substrate into said electrolyte; and
electroplating a predetermined tin, lead, or tin-lead alloy upon said substrate.

9. An electrolyte for electroplating tin, lead, or tin-lead alloys which comprises:
a soluble divalent tin compound, a soluble divalent lead compound, or both;
a soluble alkyl or alkylol sulfonic acid in an amount sufficient to provide a solution having a pH less than about 3;
a sufficient amount of a solution soluble alkylene oxide condensate compound having at least about 8 moles of alkylene oxide to provide an electrolyte having a cloud point above about 90° F.; and a soluble bismuth compound in a sufficient amount to extend the current density range for electroplating or the brightness of the resultant electrodeposits.

10. The electrolyte of claim 9 further comprising an aromatic aldehyde.

11. The electrolyte of claim 10 further comprising acetaldehyde.

12. A method for electroplating tin, lead, or tin-lead alloys which comprises:
immersing at least a portion of a substrate into the electrolyte of claim 11; and
electroplating a predetermined tin, lead or tin-lead alloy upon said substrate.

13. A method for electroplating tin, lead, or tin-lead alloys which comprises:
immersing at least a portion of a substrate into the electrolyte of claim 10; and
electroplating a predetermined tin, lead or tin-lead alloy upon said substrate.

14. The electrolyte of claim 10 further comprising acetaldehyde.

15. A method for electroplating tin, lead, or tin-lead alloys which comprises:
immersing at least a portion of a substrate into the electrolyte of claim 14; and
electroplating a predetermined tin, lead or tin-lead alloy upon said substrate.

16. A method for electroplating tin, lead, or tin-lead alloys which comprises:
immersing at least a portion of a substrate into the electrolyte of claim 9; and
electroplating a predetermined tin, lead or tin-lead alloy upon said substate.

17. A method for preparing an electrolyte for electroplating tin, lead or tin-lead alloys which comprises:
adding to a suitable solvent a predetermined amount of a soluble divalent tin compound, a soluble divalent lead compound, or both, and a soluble alkyl or alkylol sulfonic acid in an amount sufficient to provide a solution having a pH of less than about 3;
adding to said solution, a sufficient amount of a soluble alkylene oxide condensate compound having at least about 8 moles of alkylene oxide to provide an electrolyte having a cloud point above about 90° F. to improve the cathode efficiency during electroplating and to produce tin, lead or tin-lead alloy electrodeposits having good solderability;
adding to said solution a sufficient amount of an aromatic aldehyde to improve the brightness of the deposit produced by electroplating; and
adding to said solution a sufficient amount of acetaldehyde to improve the high current density range for electroplating.

18. A method for electroplating tin, lead, or tin-lead alloys upon a substrate which comprises:
preparing an electrolyte according to the method of claim 17;
immersing at least a portion of a substrate into said electrolyte; and
electroplating a predetermined tin lead, or tin-lead alloy upon said substrate.

19. An electrolyte for electroplating tin, lead, or tin-lead alloys which comprises:
a soluble divalent tin compound, a soluble divalent lead compound, or both;
a soluble alkyl or alkylol sulfonic acid in an amount sufficient to provide a solution having a pH less than about 3;

a sufficient amount of a solution soluble alkylene oxide condensate compound having at least about 8 moles of alkylene oxide to provide an electrolyte having a cloud point above about 90° F.;

an aromatic aldehyde in a sufficient amount to improve the brightness of the deposit produced by electroplating; and acetaldehyde in a sufficient amount to extend the high current density range for producing bright deposits.

20. A method for electroplating tin, lead or tin-lead alloys which comprises:

immersing at least a portion of a substrate into the electrolyte of claim 19; and electroplating a predetermined tin, lead or tin-lead alloy upon said substrate.

* * * * *